US007405592B2

(12) United States Patent
Ghobadian

(10) Patent No.: US 7,405,592 B2
(45) Date of Patent: *Jul. 29, 2008

(54) INTEGRATED CIRCUIT CAPABLE OF MINIMIZING SWITCH TRANSITIONS

(75) Inventor: Farzad Ghobadian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 432 days.

This patent is subject to a terminal disclaimer.

(21) Appl. No.: 10/999,322

(22) Filed: Nov. 30, 2004

(65) Prior Publication Data

US 2006/0116100 A1    Jun. 1, 2006

(51) Int. Cl.
*H03K 19/094* (2006.01)
*H03B 1/00* (2006.01)

(52) U.S. Cl. ............................. 326/82; 326/83; 326/86; 326/87; 327/108; 327/109

(58) Field of Classification Search .................. 326/17, 326/26, 27, 82, 83, 86, 59, 60; 327/108, 327/109, 379

See application file for complete search history.

(56) References Cited

U.S. PATENT DOCUMENTS 6,590,432 B1 * 7/2003 Wu et al. ..................... 327/108
7,206,989 B2 * 4/2007 Beckett et al. ............... 714/766

OTHER PUBLICATIONS

PCI Express Base Specification Revision 1.0, Jul. 22, 2002, 228 pgs.
PCI-X Addendum to the PCI Local Bus Specification Revision 1.0a Jul. 24, 2000 PCI Special Interest Group, 240 pgs.
American Natioanal Standard: For Information Technology-Fibre Channel-Physical and Signalling Interface-3 (FC-PH-3) Developed by Incits, 1998, 135 pgs.
Serial AT: High Speed Serialized AT Attachment: Revision 1.0a Jan. 7, 2003, APT Technologies, Inc., Dell Computer Corporation, IBM Corporation, Intel Corporation, Maxtor Corporation, Seagate Corporation, 311 pgs.
Information Technology—Serial Attached SCSI—1.1 (SAS-1.1), Working Draft American National Standard: Project T10/1601-D Revision 1, Sep. 18, 2003, 464 pgs.
Serial ATA II: Extensions to Serial ATA 1.0a Revision 1.2, Aug. 27, 2004, 110 pgs.

* cited by examiner

*Primary Examiner*—Rexford Barnie
*Assistant Examiner*—Thienvu V Tran
(74) *Attorney, Agent, or Firm*—Grossman, Tucker, Perreault & Pfleger, PLLC

(57) ABSTRACT

A method according to one embodiment may include switching, by an integrated circuit, a plurality of switches to generate at least one output signal having a first amplitude and a second amplitude. The method according to this embodiment may also include controlling, by the integrated circuit, a conduction state of the plurality of switches to include a first conduction state and a second conduction state. The method according to this embodiment may also include minimizing, by the integrated circuit, the number of switch transitions between the first conduction state and the second conduction state of at least one switch when the output signal goes from the first amplitude to the second amplitude. Of course, many alternatives, variations, and modifications are possible without departing from this embodiment

17 Claims, 5 Drawing Sheets

US 7,405,592 B2

INTEGRATED CIRCUIT CAPABLE OF MINIMIZING SWITCH TRANSITIONS

FIELD

The present disclosure relates to an integrated circuit capable of minimizing switch transitions.

BACKGROUND

In one conventional data storage arrangement, a computer node includes a host bus adapter (HBA). The HBA communicates with a data storage system via one or more communication links using a communication protocol associated with the data storage system. The HBA may transmit a serial stream of data to one or more target devices, and the amplitude of the serial data stream may be selected by the communications protocol. In the conventional system, multiple switches are used to produce a serial data stream. In the conventional system, transitions between binary values in a serial data stream are accomplished using conventional inverter circuits. Using conventional inverter circuits, a large number of switches must switch states to transition between binary values. A large number of switch transitions may operate to introduce noise in the serial data stream, and the conventional system may require complex additional circuits to reduce noise. Thus, the conventional system is incapable of reducing noise in the serial data stream without introducing complex noise-reduction circuitry.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

Figure 1:
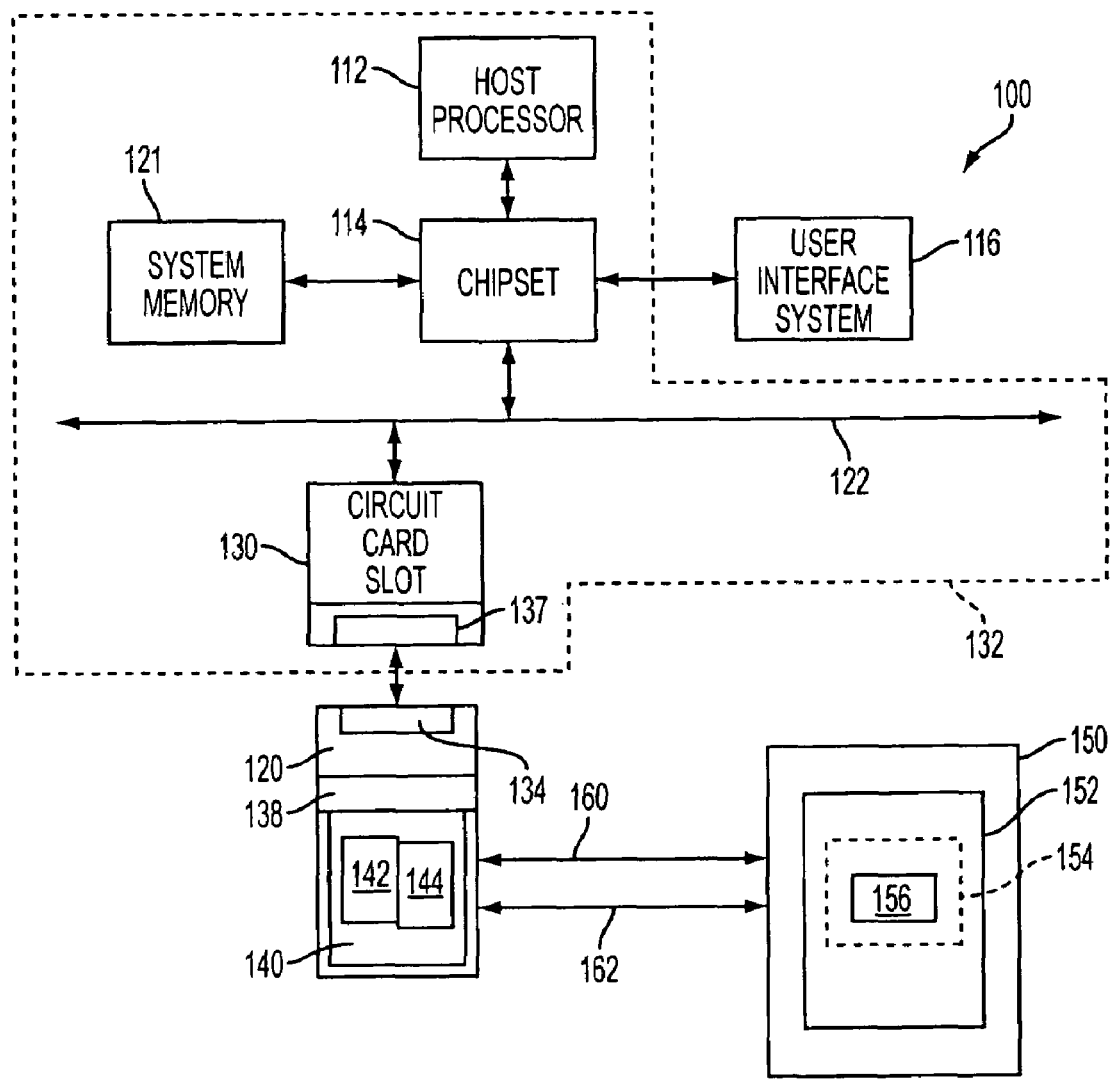
FIG. 1 is a diagram illustrating a system embodiment.

FIG. 1 illustrates a system embodiment 100 of the claimed subject matter. The system 100 may generally include a host system 132 which may include a host processor 112, a bus 122, a user interface system 116, a chipset 114, system memory 121, a circuit card slot 130, and a circuit card 120 that is capable of communicating with the mass storage 150. The host processor 112 may include any variety of processors known in the art such as an Intel® Pentium® IV processor commercially available from the Assignee of the subject application. The bus 122 may include various bus types to transfer data and commands. For instance, the bus 122 may comply with the Peripheral Component Interconnect (PCI) Express™ Base Specification Revision 1.0, published Jul. 22, 2002, available from the PCI Special Interest Group, Portland, Oreg., U.S.A. (hereinafter referred to as a "PCI Express™ bus"). The bus 122 may also comply with the PCI-X Specification Rev. 1.0a, Jul. 24, 2000, available from the aforesaid PCI Special Interest Group, Portland, Oreg., U.S.A. (hereinafter referred to as a "PCI-X bus").

The user interface 116 may include a variety of devices for human users to input commands and/or data and to monitor the system such as a keyboard, pointing device, and video display. The chipset 114 may include host bridge/hub system (not shown) that couples the processor 112, system memory 121, and user interface system 116 to each other and to the bus 122. Chipset 114 may include integrated circuit chips, such as those selected from integrated circuit chipsets commercially available from the assignee of the subject application (e.g., graphics memory and I/O controller hub chipsets), although other integrated circuit chips may also, or alternatively be used. The processor 112, system memory 121, chipset 114 and circuit card slot 130 may be integrated onto a motherboard. The processor 112, system memory 121, chipset 114 and circuit card slot 130 may comprise a host system 132.

The circuit card 120 may be constructed to permit it to be inserted into slot 130. When the circuit card 120 is properly inserted into slot 130, connectors 134 and 137 become electrically and mechanically coupled to each other. When connectors 134 and 137 are so coupled to each other, the card 120 becomes electrically coupled to bus 122 and may exchange data and/or commands with system memory 121, host processor 112, and/or user interface system 116 via bus 122 and chipset 114. Alternatively, without departing from this embodiment, the operative circuitry of the circuit card 120 may be included in other structures, systems, and/or devices. These other structures, systems, and/or devices may be, for example, in the motherboard 132, coupled to the bus 122. Processor 112, system memory 121, chipset 114, bus 122, and circuit card slot 130 may be comprised in a single circuit board. Alternatively, and without departing from this embodiment, circuit card 120 may comprise one or more chipsets comprised in a system motherboard.

The circuit card 120 may communicate with mass storage 150 using a plurality of communication protocols. Circuit card 120 may comprise a host bus adaptor (HBA) which may be capable of exchanging commands and data between processor 112 and mass storage 150. The circuit card 120 may comprise at least one integrated circuit 140 capable of initiating communication between the host system 132 and mass storage 150. As used in any embodiment herein, an "integrated circuit" means a semiconductor device and/or microelectronic device, such as, for example, but not limited to, a semiconductor integrated circuit chip.

The circuit card 120 may also comprise memory 138. Memory 138 may comprise one or more of the following types of memories: semiconductor firmware memory, programmable memory, non-volatile memory, read only memory, electrically programmable memory, random access memory, flash memory, magnetic disk memory, and/or optical disk memory. Either additionally or alternatively, memory 138 may comprise other and/or later-developed types of computer-readable memory. Machine-readable firmware program instructions may be stored in memory 138. As described below, these instructions may be accessed and executed by integrated circuit 140. When executed by integrated circuit 140, these instructions may result in integrated circuit 140 performing the operations described herein as being performed by integrated circuit 140. Additionally, and as will be described in more detailed below, memory 138 and/or other memory (not shown) may be capable of storing data which may be associated with the operation of integrated circuit 140.

If a Fibre Channel (FC) protocol is used by circuit card 120 to exchange data and/or commands with mass storage 150, it may comply or be compatible with the interface/protocol described in "ANSI Standard Fibre Channel Physical and Signaling Interface-3 X3.303:1998 Specification." Alternatively or additionally, if a Serial ATA (SATA) protocol is used by controller circuit card 120 to exchange data and/or commands with mass storage 150, it may comply or be compatible with the protocol described in "Serial ATA: High Speed Serialized AT Attachment," Revision 1.0a, published on Jan. 7, 2003 by the Serial ATA Working Group and/or the protocol described in "Serial ATA II: Extensions to Serial ATA 1.0a," Revision 1.2, published Aug. 27, 2004 by the Serial ATA Working Group and/or earlier and/or later published versions of the SATA standard. Further alternatively or additionally, if a Serial Attached Small Computer System Interface (SAS) protocol is used by controller circuit card 120 to exchange data and/or commands with mass storage 150, it may comply or be compatible with the protocol described in "Information Technology—Serial Attached SCSI—1.1," Working Draft American National Standard of International Committee For Information Technology Standards (INCITS) T10 Technical Committee, Project T10/1562-D, Revision 1, published Sep. 18, 2003, by American National Standards Institute (hereinafter termed the "SAS Standard") and/or earlier and/or later published versions of the SAS Standard.

Circuit card 120 may be coupled to mass storage 150 via one or more network communication links 160, 162. In this embodiment, mass storage 150 may comprise, e.g., one or more redundant arrays of independent disks (RAID) 152. RAID 152 may comprise, for example, one or more disk mass storage devices and/or one or more peripheral devices (collectively shown in FIG. 1 by the block referred to by numeral 156) comprised in a protocol domain 154. As used herein, "protocol domain" means one or more apparatus that may communicate in accordance with a communication protocol. Also, in this embodiment, communication links 160 and 162 may comprise a differential pair communication data transmission link, which in combination may be capable of communicating commands and/or data from integrated circuit 140 to mass storage 150.

Integrated circuit 140 may comprise protocol initiator circuitry 142 ("initiator circuitry 142"). As used in any embodiment herein, "circuitry" may comprise, for example, singly or in any combination, hardwired circuitry, programmable circuitry, state machine circuitry, and/or firmware that stores instructions executed by programmable circuitry. Also, in any embodiment herein, circuitry may be embodied as, and/or form part of, one or more integrated circuits. In this embodiment, initiator circuitry 142 may exchange commands and/or data with mass storage 150, via links 160 and 162, using, for example SATA protocol, SAS protocol and/or FC protocol.

Integrated circuit may also comprise transmit circuitry 144. Transmit circuitry 144 may be capable of generating one or more signals in accordance a protocol used by initiator circuitry. For example, transmit circuitry 144 may be capable of generating a at least one output signal having an amplitude that complies or is compatible with the aforementioned SAS, SATA and/or FC communication protocols. At least one out put signal generated by transmit circuitry 144 may comprise command and/or data signals and may be transmitted to mass storage 150 via communication links 160 and/or 162.

Figure 2:
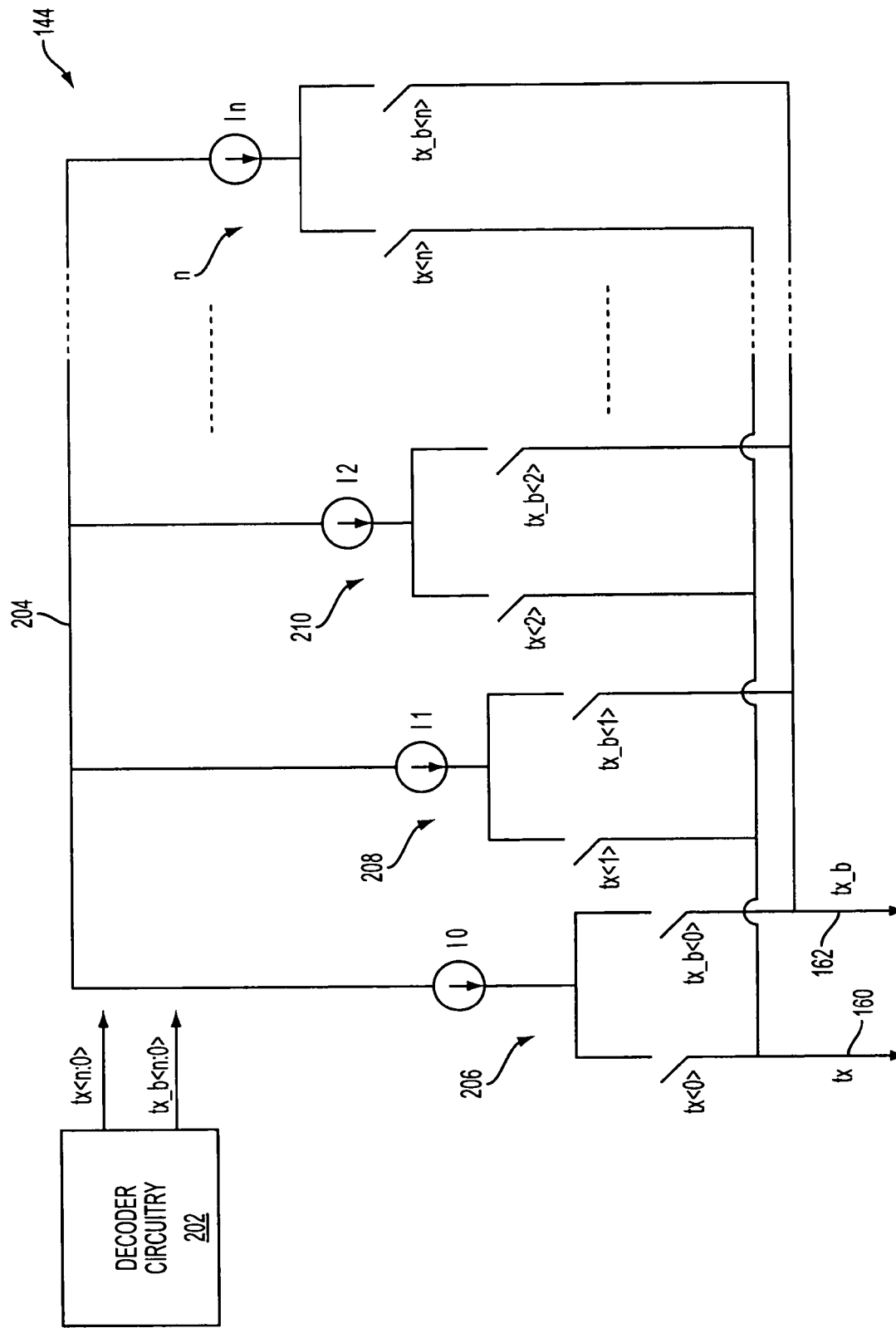
FIG. 2 is a diagram illustrating exemplary transmit circuitry according to one embodiment.

FIG. 2 illustrates exemplary transmit circuitry 144 according to one embodiment. In FIG. 2, certain portions of the system 100 depicted in FIG. 1 have been omitted for clarity (for example circuit board 132 and circuit card 120), but it is to be understood that like parts of FIG. 2 can be implemented in a manner consistent with an embodiment depicted in FIG. 1, or alternatively in other system implementations, without departing from this embodiment. Transmit circuitry 144 may comprise decoder circuitry 202 and differential signal generating circuitry 204. Differential signal generating circuitry 204 may be capable of generating at least one output signal, which may include differential output signals tx (160) and tx_b (162), which may represent a complementary pair of differential binary signals. In this embodiment, differential signal generating circuitry 204 may comprise a plurality of differential circuits, for example, 206, 208, 210, . . . , n. Each differential circuit may comprise a current source (e.g., I 0, I1, I2, . . . , I n) and a pair of switches, designated tx<0>, tx_b<0> for differential circuit 206, tx<1>, tx_b<1> for differential circuit 208, tx<2>, tx_b<2>for differential circuit 210 and tx<n>, tx_b<n> for differential circuit n. "Switch" as used in any embodiment herein may comprise circuitry capable of changing conduction states and may include, for example, at least one field-effect transistor (FET) and/or bi-polar junction transistor (BJT). In this embodiment, the current source may be equally weighted (i.e., each current source may generate approximately the same current), and differential circuits 206, 208, 201, . . . , n may comprise identical circuitry.

The tx switches (i.e., switches tx<0>, tx<1>, tx<2>, . . . , tx<n>) may be coupled together and the outputs thereof may be summed to form the tx signal 160. Likewise, the tx_b switches may be coupled together and the outputs thereof may be summed to form the tx_b signal 162. By convention, as used in an embodiment herein, the difference between tx and tx_b may produce a binary "1" (i.e., tx−tx_b=1), and the difference between tx_b and tx may produce a binary "0" (i.e., tx_b−tx=0), although it is equally contemplated in alternative embodiments herein that the reverse may be true, i.e., tx−tx_b=0 and tx_b−tx=1. Also, by convention, in any embodiment herein, an open switch may be designated as a 0, while a closed switch (closed meaning the switch provides a conduction path for respective current sources comprised in differential circuits) may be designated as a 1 (although it is equally contemplated in alternative embodiments that the reverse may be true, i.e., an open switch may be designated as a 1, and a closed switch may be designated as a 0). The amplitude of the tx and tx_b signals may be based on the number of respective tx and tx_b switches that are closed. The number of differential circuits 206, 208, 210, . . . , n provided by the differential signal generating circuitry 204 may be based on, for example, a desired amplitude granularity for an application or set of applications.

Figure 3:
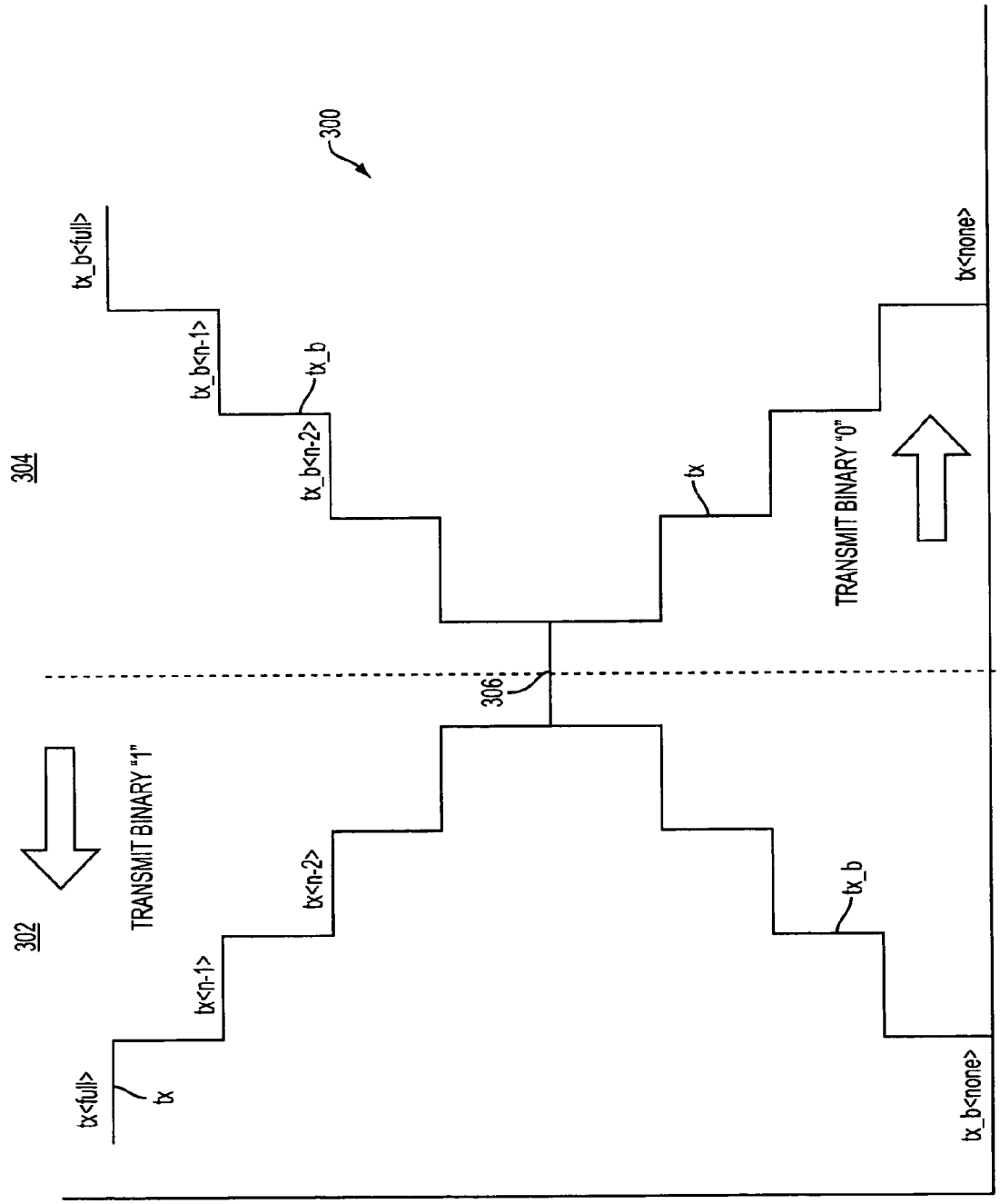
FIG. 3 is a diagram illustrating exemplary output signals of the exemplary transmit circuitry of FIG. 2.

FIG. 3 depicts a graphical representation of exemplary tx and tx_b signals 300 which may be generated according to an embodiment. Taken in conjunction with FIG. 2 (and the description thereof), in this example, the "y" axis represents current amplitude I and the "x" axis represents time. As depicted, the tx signal can assume a plurality of amplitude values, which may be based on the number of differential circuits and the number of closed tx switches. For example, if all of the tx switches are closed, the amplitude of the tx signal, represented by "tx<full>" in the figure, may represent a maximum current value that may be generated by the differential signal generating circuitry 204. Following this example, if (n-1) of the tx switches are closed, the amplitude of the tx signal 160 may be represented by tx<n-1>. The amplitude of the tx signal may be generated to have a plurality of amplitudes, as depicted, including a minimum amplitude, represented by tx<none>, which may result when none of the tx switches are closed. Similarly, the amplitude of the tx_b signal may be generated to have a plurality of amplitudes, for example, ranging from a minimum amplitude represented by tx_b<none> (which may result when none of the tx_b switches are closed), to a maximum amplitude represented by tx_b<full> (which may result when all of the tx_b switches are closed).

In this embodiment tx and tx_b may comprise complimentary signals. As depicted in FIG. 3, a binary "1" may be transmitted when the amplitude of tx is greater than tx_b (i.e., tx>tx_b). A binary "0" may be transmitted when the amplitude of the tx_b signal is greater than the tx signal (i.e., tx_b>tx). When tx=tx_b, depicted graphically in FIG. 3 by numeral 306, an idle state may occur, and may represent a transition between a binary values. As stated previously, the amplitude of a binary "1" may be represented by tx−tx_b, and the amplitude of a binary "0" may be represented by tx_b−tx. Also, in this embodiment, current sources, generating respective amplitude values for the tx and tx_b signals, may be equally weighted, and thus, any of the tx and/or tx_b switches may be used to generate a selected amplitude.

Referring again to the exemplary embodiment of FIG. 2, and as stated herein, transmit circuitry 144 may comprise decoder circuitry 202. Decoder circuitry 202 may be capable of generating one or more control signals to control the conduction state of one or more tx switches, represented by tx<n:0>. Similarly, Decoder circuitry 202 may be capable of generating one or more control signals to control the conduction state of one or more tx_b switches, represented by tx_b<n:0>. As used in any embodiment herein, "conduction state", may comprise an open condition (non-conducting) and/or a closed condition (conducting). In one embodiment, tx control signals (tx<n:0>) and/or tx_b control signal (tx_b<n:0>) may be generated by decoder circuitry 202 independently of each other. In at least one embodiment herein, decoder circuitry 202 may be capable of minimizing the number of tx and/or tx_b switches that may change conduction states when transitioning between binary values, for example, when transitioning from a binary "1" to a binary "0" and/or when transitioning from a binary "0" to a binary "1".

Figure 4B:
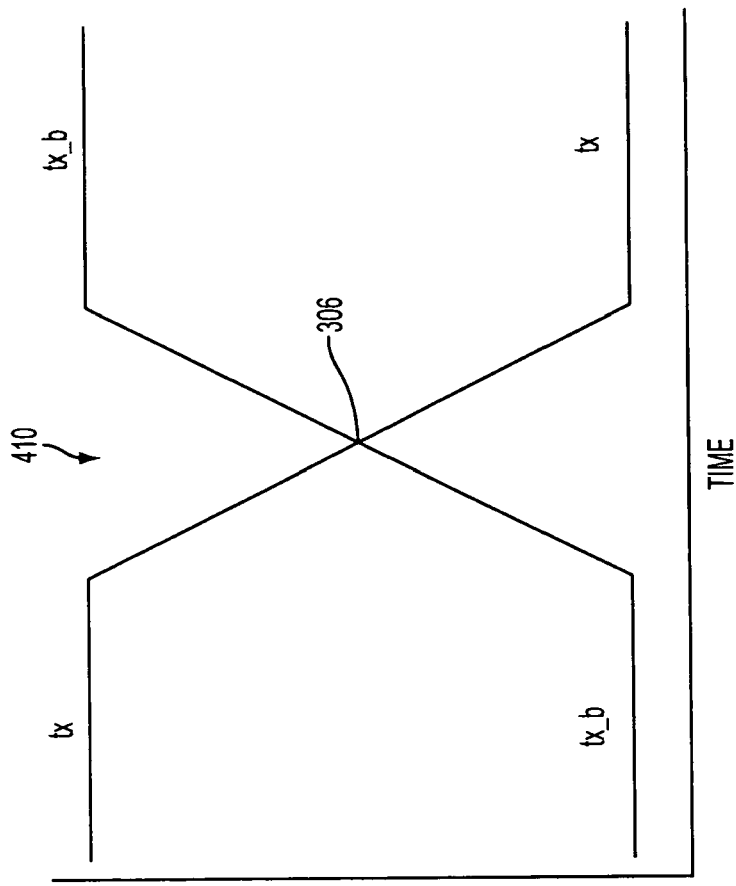
FIG. 4B is a diagram illustrating exemplary output signals of the exemplary transmit circuitry of FIG. 2 according to another embodiment.
Figure 4A:
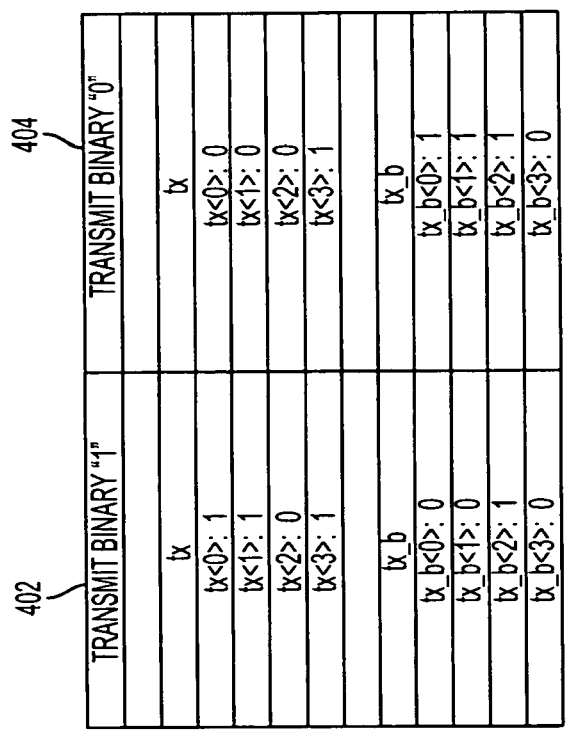
FIG. 4A is a table of exemplary bit values for binary signal transmission of the exemplary transmit circuitry of FIG. 2.

FIG. 4A depicts an exemplary table 405 of operations of differential transmit circuitry 144 according to an embodiment, and FIG. 4B depicts an exemplary graph of tx and tx_b signals which may be generated according to the operations of FIG. 4A. In this example, assume that differential signal generating circuitry 204 may include four differential circuits, and that each differential circuit includes four respective tx switches (tx<0>, tx<1>, tx<2> and tx<4>) and four respective tx_b switches (tx_b<0>, tx_b<1>, tx_b<2> and tx_b<3>). Also, assume that each respective differential circuit may generate equally weighted amplitude values that when summed together may produce tx and tx_b signals. The left column 402 of table 405 may represent tx signal values and tx_b signal values which, in combination, may transmit a binary "1" value. The right column 404 of table 405 may represent tx signal values and tx_b signal values which, in combination, may transmit a binary "0" value. Although this example depicts four differential circuits, it is to be understood that the present embodiment may include any number of differential circuits, and that four differential circuits are only provided for clarity in understanding operations according to this embodiment.

In this example, the number 1 in the columns under respective tx and tx_b signals may represent that a switch is closed, and a 0 in the columns under respective tx and tx_b signals may represent that a switch is open. In other words, each switch may generate a 1 (meaning that current may be flowing through the switch) or a 0 (meaning that current may not be flowing through the switch). Thus for example, a number 1 in column 402 and/or 404 may mean that a switch is closed (i.e., conducting), and the number 0 in the column 402 and/or 404 under respective tx and tx_b signals may represent that the switch for the differential circuit is open (i.e., non-conducting). In this example, to transmit a binary "1" value (column 402), the tx<0>, tx<1> and tx<3> switches may be closed (conducting), and the tx_b<2> switch may be conducting. As with a previous embodiment described herein, the binary "1" value may comprise the difference between tx and tx_b, i.e., tx−tx_b. The remaining switches for both tx and tx_b may be open (non-conducting). Respective amplitude values for tx and tx_b in column 402 may be graphically represented, as depicted in FIG. 4B, where tx is greater than tx_b for a predetermined time period to transmit a binary "1".

Continuing this example, to transmit a binary "0" value (column 404), the tx<3> switch may be closed (conducting) which may operate to produce a logical complimentary tx signal between the "1" and "0" binary states, and tx_b<0>, tx_b<1> and tx_b<2> switches may be conducting which may operate to produce a logical complimentary tx_b signal between the "1" and "0" binary states. As with a previous embodiment described herein, the binary "0" value may comprise the difference between tx_b and tx i.e., tx_b−tx. The remaining switches for both tx and tx_b may be open (non-conducting). Respective amplitude values for tx and tx_b in column 404 may be graphically represented, as depicted in FIG. 4B, where tx_b is greater than tx for a predetermined time period to transmit a binary "0". An idle period 306 may be present between transition from "1" to "0", and vice-versa.

In this embodiment, when tx transitions from a "1" (column 402) to a "0" (column 404), decoder circuitry 202 may be capable of minimizing at least one switch transition among the plurality of tx and/or tx_b switches. "Minimizing", as used in any embodiment herein with respect to switch transitions of the transmit circuitry 144, may be defined as reducing at least one switch transition. "Switch transition", as used in any embodiment herein, may be defined as a switch going from closed conduction state to an open conduction state and/or a switch going from an open conduction state to a closed conduction state. Further, "minimizing" shall not be construed as covering only a reduction of all switch transitions to a minimum, but rather, this term shall be construed and used herein as covering any reduction of switch transitions, including reducing at least one or any number of switch transitions to a minimum. Thus, for example, and consistent with the definition of minimizing, decoder circuitry 202 may be capable of eliminating at least one switch transition between binary states (e.g., "1" to "0" and/or "0" to "1") of the tx and/or tx_b switches.

In the exemplary table of FIG. 4A, the tx switches in the binary state "0" may be complimentary in total amplitude to the tx_b switches in the binary state "1". Decoder circuitry 202 may be capable of determining the total number of switch transitions between binary states for the plurality of tx and/or tx_b switches which may generate a selected amplitude. Also, in this embodiment, decoder circuitry 202 may be capable of reducing the number of switch transitions between binary states. For example, switches tx<0> and tx<1> switch from 1 (closed) to 0 (open) between binary states "1" (column 402) to "0" (column 404). Since the tx switches when transmitting a binary "0" may generate an amplitude equal to the the amplitude of the tx_b switches when transmitting a binary "1" (i.e., tx and tx_b may be complimentary), decoder circuitry 202 may be capable of determining that switches tx<2> and tx<3> may be left unswitched between binary states. Thus, in this example, the tx<2> switch remains open and the tx<3> switch remains closed.

Continuing this example, tx_b<0> and tx_b<1> switch from 1 (closed) to 0 (open) between binary states "1" (column 402) to "0" (column 404). Since the tx_b switches when transmitting a binary "0" (column 404) may generate an amplitude equal to the amplitude of the tx switches when transmitting a binary "1" (column 402) (i.e., tx and tx_b may be complimentary), decoder circuitry 202 may be capable of determining that switches tx_b<2> and tx_b<3> may be left unswitched between binary states. Thus, in this example, the tx_b<2> switch remains closed and the tx_b<3> switch remains closed. The respective amplitudes for the tx and tx_b signals are depicted in FIG. 4B as being complimentary.

Figure 5:
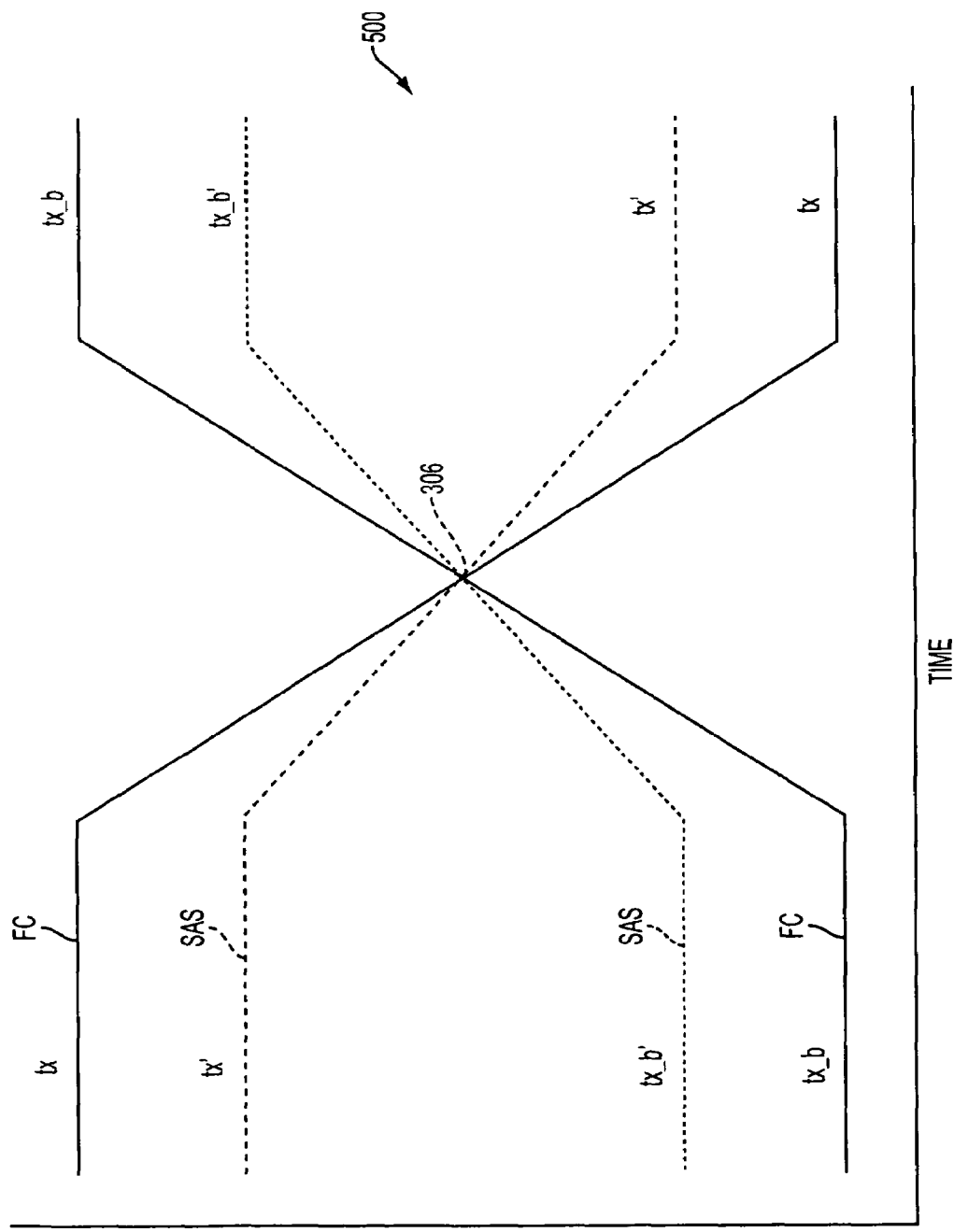
FIG. 5 is a diagram illustrating exemplary output signals of the exemplary transmit circuitry of FIG. 2 according to another embodiment.

Thus, instead of inverting all the switches when transitioning from transmitting a binary "1" to a binary "0" (or vice versa), in this embodiment the decoder circuitry 202 may be capable As stated, transmit circuitry 144 may be capable of generating one or more signals in accordance with a protocol used by initiator circuitry 142. For example, FIG. 5 is a diagram illustrating exemplary output signals 500 of the exemplary transmit circuitry of FIG. 2 according to another embodiment. In this example, transmit circuitry 144 may be capable of generating a plurality of complimentary tx and tx_b signals having an amplitude that complies or is compatible with the aforementioned SAS and/or FC communication protocols. In this example, the FC communications protocol may specify complimentary signals having a greater differential amplitude than the SAS communications protocol.

Thus, one embodiment disclosed herein may provide an integrated circuit capable of switching a plurality of switches to generate at least one output signal, the output signal having a first amplitude and a second amplitude. The integrated circuit may be further capable of controlling a conduction state of the plurality of switches to include a first conduction state and a second conduction state. The integrated circuit may be further capable of minimizing the number of switch transitions between the first conduction state and the second conduction state of at least one switch when the output signal goes from the first amplitude to the second amplitude.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system, comprising:
a circuit card comprising an integrated circuit capable of communicating in accordance with a plurality of different communication protocols, the circuit card configured to be coupled to a bus, said integrated circuit further including decoder circuitry configured to switch a plurality of switches to generate at least one output signal, said output signal having a first amplitude and a second amplitude, said decoder circuitry further configured to control a conduction state of each of said plurality of switches to include a first conduction state and a second conduction state, said decoder circuitry being further configured to determine a total number of switch transitions between said first conduction state and said second conduction state for a plurality of switches, said decoder circuitry further configured to reduce the number of switch transitions between binary states of at least one said switch when said output signal goes from said first amplitude to said second amplitude, said decoder circuitry further configured to determine a number of switches that may be left unswitched between said first conduction state and said second conduction state.

2. The system of claim 1, wherein:
said minimizing comprising controlling, by said integrated circuit, the conduction state of at least one said switch to be the same conduction state between said first amplitude and said second amplitude of said output signal.

3. The system of claim 1, wherein:
said at least one output signal includes a first output signal and a second output signal, said first output signal and said second output signal having complimentary respective amplitudes.

4. The system of claim 1, wherein:
said integrated circuit comprising a plurality of differential circuits, each said differential circuit comprising at least one said switch and a current source, wherein said output signal comprising the sum of the outputs of each said differential circuit.

5. The system of claim 4, wherein:
each said current source is equally weighted and produces approximately the same current value.

6. The system of claim 1, wherein:
said output signal comprises commands or data signals that complies with at least one said communications protocol.

7. The system of claim 6, wherein:
said communications protocol is selected from the group consisting of a FC communications protocol, a SAS communications protocol, and a SATA communications protocol.

8. An apparatus comprising:
an integrated circuit including decoder circuitry configured to switch a plurality of switches to generate at least one output signal, said output signal having a first amplitude and a second amplitude, said decoder circuitry further configured to control a conduction state of each of said plurality of switches to include a first conduction state and a second conduction state, said decoder circuitry being further configured to determine a total number of switch transitions between said first conduction state and said second conduction state for a plurality of switches, said decoder circuitry further configured to reduce the number of switch transitions between binary states of at least one said switch when said output signal goes from said first amplitude to said second amplitude, said decoder circuitry further configured to determine a number of switches that may be left unswitched between said first conduction state and said second conduction state.

9. The apparatus of claim 8, wherein:
said integrated circuit is further configured to control the conduction state of at least one said switch to be the same conduction state between said first amplitude and said second amplitude of said output signal.

10. The apparatus of claim 8, wherein:
said at least one output signal includes a first output signal and a second output signal, said first output signal and said second output signal having complimentary respective amplitudes.

11. The apparatus of claim 8, wherein:
said integrated circuit comprising a plurality of differential circuits, each said differential circuit comprising at least one said switch and a current source, wherein said output signal comprising the sum of the outputs of each said differential circuit.

12. The apparatus of claim 11, wherein:
each said current source is equally weighted and produces approximately the same current value.

13. A method, comprising:
switching, by decoder circuitry of an integrated circuit, a plurality of switches to generate at least one output signal, said output signal having a first amplitude and a second amplitude;
controlling, by said decoder circuitry, a conduction state of each of said plurality of switches to include a first conduction state and a second conduction state, said decoder circuitry being further configured to determine a total number of switch transitions between said first conduction state and said second conduction state for said plurality of switches;
minimizing, by said integrated circuit, the number of switch transitions between binary states of at least one said switch when said output signal goes from said first amplitude to said second amplitude; and
determining a number of switches that may be left unswitched between said first conduction state and said second conduction state.

14. The method of claim 13, further comprising:
controlling, by said integrated circuit, the conduction state of at least one said switch to be the same conduction state between said first amplitude and said second amplitude of said output signal.

15. The method of claim 13, further comprising:
generating, by said integrated circuit, respective control signals to control said conduction state of said plurality of switches.

16. The method of claim 13, wherein:
said integrated circuit comprising a plurality of differential circuits, each said differential circuit comprising at least one said switch and a current source, wherein said output signal comprising the sum of the outputs of each said differential circuit.

17. The method of claim 16, wherein:
each said current source is equally weighted and produces approximately the same current value.

\* \* \* \* \*

UNITED STATES PATENT AND TRADEMARK OFFICE
CERTIFICATE OF CORRECTION

PATENT NO. : 7,405,592 B2  Page 1 of 1
APPLICATION NO. : 10/999322
DATED : July 29, 2008
INVENTOR(S) : Ghobadian It is certified that error appears in the above-identified patent and that said Letters Patent is hereby corrected as shown below:

On the Title Page Item (56), under "Other Publications", line 3, delete "Natioanal" and insert -- National --, therefor.

Signed and Sealed this

Twenty-eighth Day of October, 2008

JON W. DUDAS
*Director of the United States Patent and Trademark Office*